US006748282B2

(12) United States Patent  (10) Patent No.: US 6,748,282 B2
Lin                        (45) Date of Patent:     Jun. 8, 2004

(54) FLEXIBLE DISPATCHING SYSTEM AND METHOD FOR COORDINATING BETWEEN A MANUAL AUTOMATED DISPATCHING MODE

(75) Inventor: Frank Lin, Hsin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 88 days.

(21) Appl. No.: 10/225,756

(22) Filed: Aug. 22, 2002

(65) Prior Publication Data

US 2004/0039469 A1 Feb. 26, 2004

(51) Int. Cl.$^7$ .......................... G06F 19/00; H01L 21/00
(52) U.S. Cl. .......................... 700/95; 700/83; 700/117; 700/121; 438/5
(58) Field of Search .............................. 700/28, 60, 83, 700/90, 95, 97, 117, 121; 438/5; 29/592, 592.1, 650

(56) References Cited

U.S. PATENT DOCUMENTS 6,520,727 B1 * 2/2003 Babbs et al. ............... 414/217
6,599,368 B1 * 7/2003 Morad et al. ............... 118/719
6,638,860 B2 * 10/2003 Matsunaga et al. ......... 438/684

FOREIGN PATENT DOCUMENTS

EP    1 197 990 A2 *  4/2002
GB    2 376 938 A  * 12/2002
TW      494079 A   *  7/2002

* cited by examiner

Primary Examiner—Jayprakash N. Gandhi
(74) Attorney, Agent, or Firm—Tung & Associates

(57) ABSTRACT

The present invention discloses a tool control system (TCS) having an operation management interface providing an interface for an operator to communicate with the tool control system and with an associated piece of processing equipment to allow coordination between manual and automatic dispatching of FOUPs (Front Opening Unified Pods) to the equipment within a full automatic fab. The TCS provides a daily monitoring support function allowing operators to decide when to perform a daily monitor and when to manually insert selected lots into the TCS. Additionally, a method of using the TCS to relax the loading of a wafer dispatching system is disclosed. The method provides for using manual and automated pre-dispatching functions to allow manual insertion of FOUPs within an overhead transport system and to allow prioritizing of individual wafer lots and batches of wafer lots with real-time activity in a manner optimally minimizing downtime within the TCS.

24 Claims, 4 Drawing Sheets

SiView

OPERATION MANAGEMENT INTERFACE

Machine # NPPH01    Machine Type MANU-MM-M
Machine Status SBY  LOST    Final Format

| Order # | Foup # | Class | Preset Machine | Routine # | Execution # | Part # | Lot Size |
|---|---|---|---|---|---|---|---|
| N00100.00 | NFF000010 | 4 | | NT18FT1L.00 | 002.000100 | TM6768-NCC4.00 | 22 |
| N00100.01 | NFF000010 | 4 | | NT18FT1L.00 | 002.000100 | TM6768-NCC4.00 | 3 |
| N00101.00 | NFF000019 | 4 | | NT18FT1L.00 | 002.000100 | TM6768-NCC4.00 | 25 |
| N00102.00 | NFF000066 | 4 | | NT18FT1L.00 | 002.000100 | TM6768-NCC4.00 | 25 |
| N60013.00 | B2FMA003 | 4 | | NZER001.00 | 000.000100 | ZEROPRD1.00 | 3 |
| NA0228.02 | NFF000050 | 4 | | NT18FT1L.00 | 002.000100 | TM6768-NCC4.00 | 3 |
| N-FZ0011.00G | N-FNAG003 | 3 | | NZERO01.00 | 000.000100 | ZEROPRD1.00 | 5 |
| NZ0000521.00 | NFF000027 | 4 | | NT18ZT42.0 | 000.000100 | TM3345A-NCC4.00 | 5 |

64 Preset
66 Newly added
68 Remove
70 Cancel preset
72 Adjust sequence
74 Adjust machine

Predispatch

| # | Order # | Foup # | Updated Time |
|---|---|---|---|
| 0 | | NNF000065 | 03/21 09:41 |
| 0 | NZ000C522.00 | NNF000065 | 03/21 09:41 |
| 1 | NZ0000545.00 | NNF000053 | 03/20 15:37 |
| 1 | NZ0000543.00 | NNF000052 | 03/20 15:37 |

Selected Lots

| Order # | Machine Format |
|---|---|

FIG. 2

FLEXIBLE DISPATCHING SYSTEM AND METHOD FOR COORDINATING BETWEEN A MANUAL AUTOMATED DISPATCHING MODE

FIELD OF THE INVENTION

The present invention discloses a system and method that is capable of coordinating between manual and automatic dispatching system by providing a tool control system and method having a pre-dispatch capability for relaxing the loading of a dispatch system so that the dispatching system can focus on production lots only.

BACKGROUND OF THE INVENTION

In a full-automation fab for manufacturing of semiconductor wafers or other wafer technology, an intrabay transportation facility is used. The intrabay transportation facility uses automatic guided vehicles (AGV) to dispatch and transport wafers from various load ports and processing equipment during wafer fabrication. In a wafer foundry fab, there is considerable mixing of products requiring a complex process flow thus making a dispatching system difficult to implement. The system capabilities of the existing dispatching systems are not flexible enough to conform to the flow of a variety of semiconductor production processes.

Existing dispatching systems handle both representative lot control and automated wafer dispatching. Scheduling of representative wafer lots for use in a statistical process control process must be done in advance for existing automated wafer fabs and such representative lots are not easily monitored by operators of the dispatching system.

Existing dispatch systems do not allow for multi-lot processing but rather, require operators to dispatch each lot of wafers to each piece of fabrication equipment by separately issuing detailed transfer commands from a work in process list to each equipment port for transferring a lot of wafers to another equipment port. Such an existing system does not provide for optimal lot, high priority, or batch processing.

A wafer holding device such as a Front Opening Unified Pod (FOUP) typically, capable of holding up to 25 wafers, may transport only one lot at a time, wherein each lot is often less than 25 wafers. Additionally, existing dispatching systems provide a time delay for handling super hot or high priority lots that may not be compatible with real time activity. A means for handling high priority or multiple lots within a single FOUP for processing by many pieces of fabrication equipment requires extreme complexity in existing systems, probably beyond an operator's capability to handle.

Additionally, existing dispatching systems used in a full automatic fab do not provide coordination between manual dispatching and automatic dispatching. Thus, existing automated fabs do not provide means for manually handling lots of wafers ready for dispatching to a fabrication machine. When manual insertion of a lot of wafers is needed, considerable downtime results, thus, severely impacting system performance. Therefore, a simplified methodology for using manual and automatic dispatching is essential.

It is desirable to provide a prioritized queue of FOUPs, each FOUP having multiple lots disposed within for transfer to at least one piece of fabrication equipment.

It is desirable to provide a dispatching list having meaningful lot sequence for each fabrication equipment used in the fabrication process.

It is desirable to provide an adjustable sequence of lots or jobs in a dispatching queue that is adjustable for dynamic dispatching priority changes.

It is desirable to relax loading of a dispatching system within a wafer fabrication facility.

It is desirable to provide a coordination model between manual and automatic dispatching within an automated fabrication process.

It is desirable to provide a smooth super hot lots handling model in a full automatic fab.

It is desirable to provide daily monitoring support for a full automatic fab.

It is desirable to provide batching equipment support to optimize processing of wafers in a batch type processing fabrication equipment.

It is desirable to provide a loose reservation between pre-dispatch jobs and each piece of fabrication equipment.

It is desirable to provide a method providing a new operating flow for an automated fabrication process.

SUMMARY OF THE INVENTION

In general present invention provides a system and method for coordination between a manual and an automatic dispatching system by using a tool control system (TCS) having a dispatching capability to allow for automatic handling and a pre-dispatching capability to allow manual handling in a full automatic fab. More particularly, the TCS system provides for managing wafer fabrication in a wafer fabrication process, the total control system having:

a) a plurality of FOUPs for holding at least one lot of wafers;

b) an overhead transport system for transporting FOUPs from a first location to a second location;

c) a sorter for sorting a plurality of wafer lots according to a sequence defined by the tool control system for insertion into an individual FOUP or multiple FOUPs;

d) a ceiling loader and hanger for inserting and removing FOUPs from the overhead transport system;

e) a buffer holding area for buffering FOUPs waiting to be inserted into the overhead transport system;

f) at least one piece of fabrication equipment; and an operation management interface providing an interface for an operator to communicate with the tool control system and with the at least one piece of processing equipment to allow coordination between manual and automatic dispatching of FOUPS to the at least one piece of fabrication equipment within a full automatic fab.

TCS may be operated in an automated or in a manual dispatching mode using the OMI to control dispatching of FOUPs within the TCS. The operation management interface of the TCS preferably has a work in progress portion, a selected lots configurable portion, and a pre-dispatch list portion.

Additionally, a method of using a tool control system to control and manage a wafer fabrication process during an automated mode and during a manual mode is disclosed. The method providing the steps of a) using an operation management interface to dispatch wafers to an at least one piece of fabrication equipment upon occurrence of a triggering event, the triggering event occurring when a first load port tool for the piece of fabrication equipment becomes empty;

b) checking the at least one piece of fabrication equipment's processing status;

c) issuing a move in request to an operation job supervisor if the at least one piece of fabrication equipment having a first load port is ready to receive a FOUP;

d) querying the at least one piece of fabrication equipment's processing status until the at least one piece of fabrication equipment signals that it is ready to receive a FOUP;

e) determining if a pre-dispatch list is empty;

f) collecting FOUP status information if the pre-dispatch list is not empty;

g) selecting lots from a work in progress list to create a selected lots list in a selected lots configurable portion of the operation management interface if the pre-dispatch list is empty;

h) transferring the selected lots list from the selected lots configurable portion of the operation management interface to the pre-dispatch portion to create a pre-dispatch list;

i) determining if a FOUP containing the pre-dispatched lots identified at the top of the pre-dispatch list is available to be loaded onto an overhead transport system;

j) waiting a predefined length of time if the FOUP containing the pre-dispatched lots identified at the top of the list is not available before verifying again that the FOUP identified at the top of the pre-dispatch list is available to be loaded onto the overhead transport system;

k) identifying to a FOUP queue that the FOUP containing the pre-dispatched lots identified at the top of the pre-dispatch list will be assigned to the specific piece of fabrication equipment;

l) identifying placement of the FOUP within the FOUP queue;

m) removing the lots contained within the FOUP from the pre-dispatch list if the FOUP is available for loading onto the overhead transport system;

n) issuing a transfer command to the MCS to load the FOUP onto the overhead transport system for transferring the FOUP to the at least one piece of fabrication equipment;

o) identifying that the FOUP is loaded onto the first load port of the at least one piece of fabrication equipment;

p) verifying the pre-dispatch lots listed in the FOUP are delivered to the at least one piece of fabrication equipment; and q) communicating the verification from the tool control system to the at least one piece of fabrication equipment so that the at least one piece of fabrication equipment selectively start an appropriate fabrication operation for the specific lots delivered.

BRIEF DESCRIPTION OF THE DRAWINGS

FIG. 2 is a detailed illustration of an operation management interface in accordance with the present invention.

DETAILED DESCRIPTION OF THE PREFERRED EMBODIMENTS

The present invention discloses a tool control system and method using an operation management interface (OMI) to control dispatching and predispatching of FOUPs within a fabrication process. The present invention discloses a system and method to relax the loading of a wafer dispatching system. The present invention provides coordination between a manual and an automatic dispatching system by using a tool control system (TCS) having a dispatching capability to allow for automatic handling and a predispatching capability to allow manual handling in a full automatic fab. The present invention further provides a smooth super hot lots handling model in a full automatic fab that allows operators to manually insert and prioritize top priority or super hot lots to a top priority status with real-time activity. The TCS provides a daily monitoring support function allowing operators to decide when to perform a daily monitor and when to manually insert selected lots into the TCS. Wafer orders within a PD list are manually added by an operation job supervisor (OJS) to the TCS in a manner optimally minimizing downtime within the system.

Figure 1:
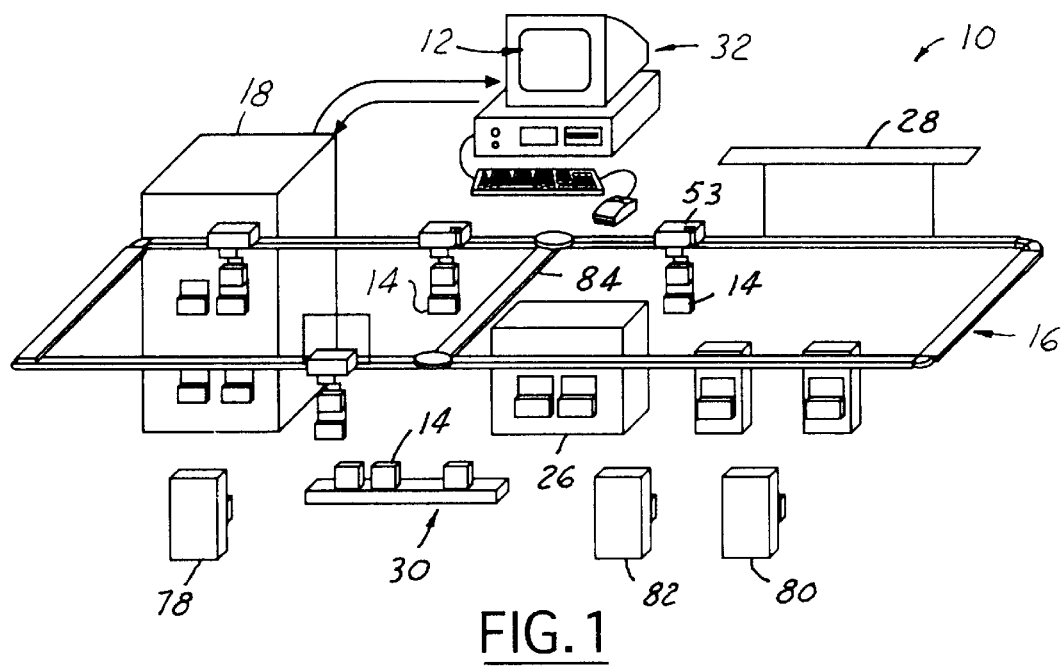
FIG. 1 is an overview of a tool control system in accordance with the present invention.
Figure 3:
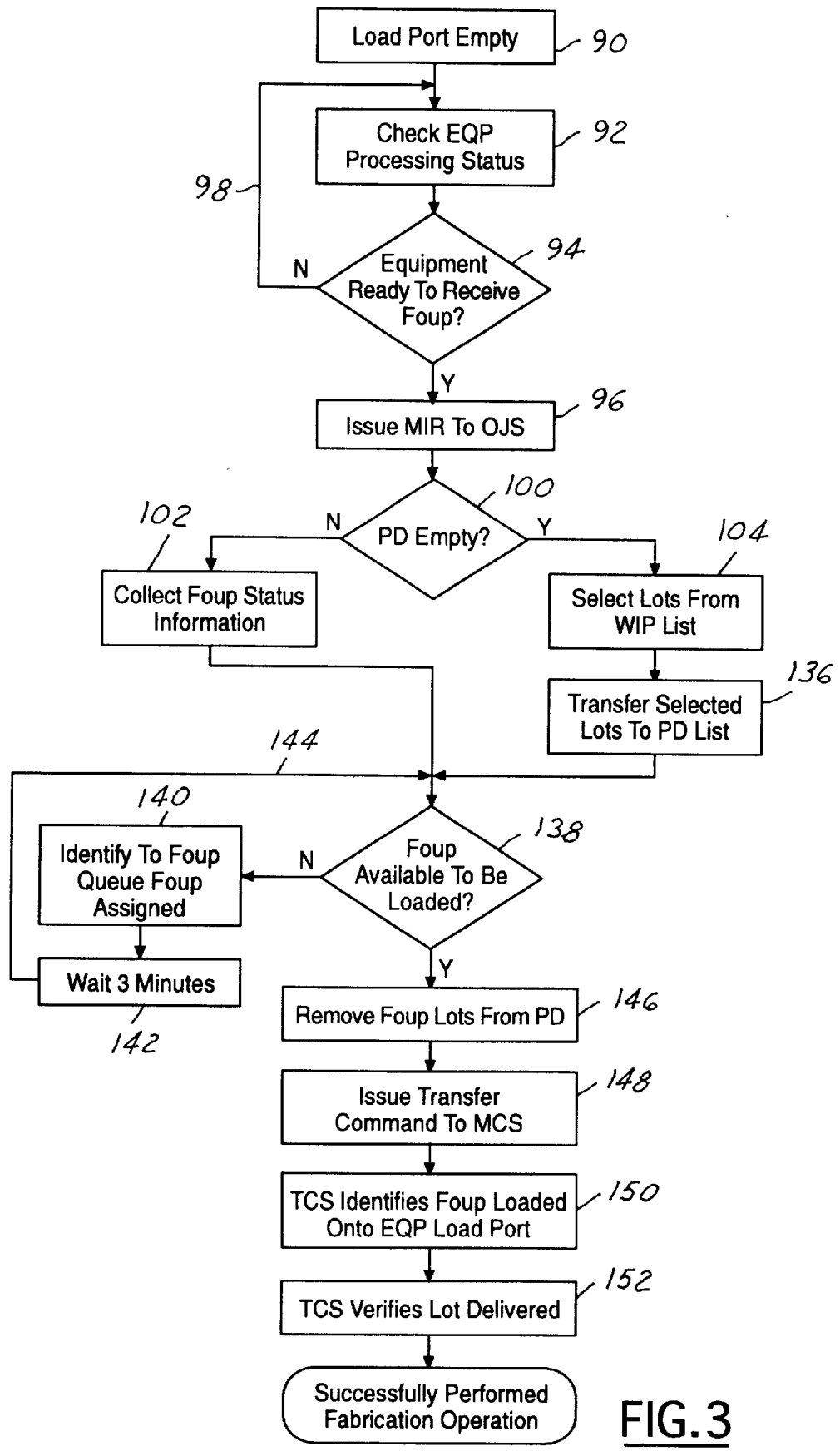
FIG. 3 is a first flowchart representing steps necessary to perform a method of using the tool control system of FIG. 1.

Referring now in more detail to the drawings, FIG. 1 illustrates an overview of a TCS 10, FIG. 2 illustrates an OMI screen 12 providing a user interface for an operator using the TCS 10, and FIGS. 2–3 illustrate a method of using the TCS 10.

More particularly, as shown in FIG. 1, the TCS 10 provides at least one or a plurality of FOUPs 14 for holding at least one lot of wafers (not shown), an overhead transport system 16 for transporting FOUPs 14 from a first location to a second location, a sorter 26 for sorting a plurality of wafer lots according to a sequence defined by the TCS 10 for insertion into a FOUP, a ceiling loader and hanger 28 for inserting and removing FOUPs 14 from the overhead transport system 16, a buffer holding area 30 for buffering FOUPs waiting to be inserted, preferably manually inserted, into the overhead transport system 16, at least one piece of fabrication equipment 18, and an OMI 32 providing an interface for an operator to communicate with the TCS 10 to allow coordination between manual and automatic dispatching of FOUPS 14 to the at least one piece of fabrication equipment 18 within a full automatic fab. The at least one piece of fabrication may be any fabrication equipment such as a processing or a pre-processing machine used in the manufacture of semiconductor wafers.

The TCS 10 uses the configurable OMI 32 to provide a loose reservation of wafers by associating a particular PD list with an associated piece of processing equipment; by allowing a pre-dispatched lot to load into multiple FOUPS, if necessary; and by forcing the overhead transport system 16 to sequentially follow commands from the PD list. The TCS 10 provides a configurable queue that results in a new operation flow by allowing operators to monitor the system status for dispatching and processing for automatic processing and for allowing manual handling of lots when necessary using a pre-dispatch system.

Preferably, the TCS 10 further provides one or a plurality of configurable OMI's 32 wherein each OMI 32 is in operable communication with an associated piece of fabrication equipment and wherein each OMI 32 is in further operable communication with the plurality of other OMIs respectively associated with different pieces of fabrication equipment (not shown). The OMI 32 is preferably, a computer system having a processor and a configurable OMI display 12 as shown in FIGS. 1–2. The OMI 32 preferably provides a batching function that has editing capabilities for optimizing batches of wafers available for processing, the editing capabilities including but not limited to creating, modifying, and deleting batches of wafers or individual wafer lots when specified.

As shown in more detail in FIG. 2, the configurable OMI display 12 provides a work in progress dispatching portion 36 for displaying a work in progress list, the work in progress list having a plurality of selectable lots disposed therewithin; a selected lots configurable portion 56 for selecting one or a plurality of selectable lots having an associated lot order number from the work in progress list for processing by the associated at least one piece of fabrication equipment; and a pre-dispatch list portion 58 having a pre-dispatch list, the pre-dispatch list providing list of individual pre-dispatch lots.

The OMI display 12 further provides a plurality of configurable fields associated with the associated at least one piece of fabrication equipment 18, the at least one piece of fabrication equipment 18 having an associated machine number and having an associated operational status. Preferably, the configurable fields provide selectable fields 20, 22, 24 for a user to identify an associated fabrication machine number, a machine type, and an associated machine status.

Additionally, the work in progress dispatching portion 36 displays a work in progress list 38. Preferably, the WIP dispatching portion has selectable associated fields 40, 42, 44, 46, 48, 50, 52, 53 for selecting and monitoring each dispatched order or lot waiting to be processed 54, each lot 54 having an order number 40, a foup number 42, a class number 44, a preset machine number 46, a routing number 48, an execution number 50, and a part number 52, and a lot size number 53.

Preferably, the selected lots configurable portion 56 selects each lot 54 having a lot or order number from the work in progress list 38 for processing by the associated at least one piece of fabrication equipment 18.

The PD list portion 58 has a pre-dispatch (PD) list 60. The PD list 60 provides a list of individual orders or PD lots 62 that are preferably prioritized prior to dispatch, each order 62 is classified according to a preset number, an order number, a foup number, and a specific date and time. Each order within the PD list 60 can be configured by using configurable PD function buttons 64, 66, 68, 70, 72, 74 to define a preset number, a newly added order, removal of an order, a canceling of an order, a presetting of an order, an adjustment of a pre-dispatch sequence, and an adjustment of a fabrication machine.

The OMI 32 allows for a loose reservation to be made between lots displayed within the WIP list 38 and the lots associated at least one piece of fabrication equipment 18 as well as between the OMI 32 and a different piece of fabrication equipment (not shown). For an automated fab operating in an automatic dispatching mode, the PD list 60 is mandatory and a lot set as top priority 76 within the PD list 60 will be sent to the associated piece of fabrication equipment 18 first before a lot listed within the WIP list 38 is sent. Each piece of equipment within the TCS 10 can specify a maximum lot wafer count to be received by the at least one piece of fabrication equipment 18.

If necessary, the piece of equipment 18 having the associated OMI 32 can communicate with a different piece of equipment (not shown) also having an associated OMI (not shown) to allow for loading portions of a pre-dispatch order into both or to a plurality of fabrication equipment without having to cancel the PD lot 62.

When the at least one piece of fabrication equipment 18 needs to receive subsequent PD lots 62, the TCS 10 will first review the PD list 60. If some lots shown in the PD list 60 were already dispatched to the associated piece of fabrication equipment 18, then the TCS 10 will prioritize the sent lots as first on the WIP list 38 without asking the PD portion to prioritize the lots. However, if operators need to raise a lot's priority to top priority for immediate processing, an operator will set this lot as top priority in the PD list 60. Thus, whenever the piece of fabrication equipment 18 is available to process a next lot, the top priority lot 76 will be picked and will be inserted into the overhead transport system 16 ahead of any lots in the WIP list 38.

The TSC 10 further provides a first load port tool 78 providing a loading port to the at least one piece of fabrication equipment 18, a second load port tool 80 in communication with the sorter 26 for communicating sorted wafer lots from the sorter to a FOUP available to be sent from the buffer holding area 30 to the at least one piece of fabrication equipment 18, and a third load port tool 82 for loading FOUPs 14 from the buffer holding area 30 to the overhead transport system 16. Preferably, the overhead transport system 16 further provides an optional shortcut 84 for routing FOUPs unavailable for processing within the at least one piece of fabrication equipment 18 to the ceiling loader and hanger 28.

In a preferred embodiment (not shown), a FOUP disposed within the buffer holding area 30 may optionally be sequenced within a FOUP queue waiting to be processed by the at least one piece of fabrication equipment 18 by loading the FOUP from the buffer holding area 30 into the at least second load port. In an alternative preferred embodiment (not shown), a FOUP disposed within the buffer holding area 30 holding a super hot lot may optionally, be manually inserted into the overhead transport system 16 for direct routing to the at least one piece of fabrication equipment 18. If a FOUP needs to be manually inserted into the system, placement of the FOUP within the FOUP queue is performed by the OMI 32. If wafers within the FOUP need further processing by a different piece of fabrication equipment, the overhead transport system 16 will service each piece of equipment according to a predefined automatic sequence of wafer lot orders 54 as displayed in a WIP dispatching list 38 described further below. When a lot or a batch of wafers 62 is pre-dispatched into the FOUP queue associated with the at least one piece of fabrication equipment 18, the lot 62 may be processed by more than one piece of fabrication equipment.

The configurable FOUP queue for a specified piece of fabrication equipment may be prioritized according to variable batch sizes and according to a unit count for each batch size The configurable queue allows for multiple lots 62 from a PD list 60 to be sent to a specified piece of fabrication equipment in a prioritized manner; allows for coordination between a maximized PD lot or order to be processed by a corresponding piece of equipment; allows for operators to prevent shortages by manually inserting additional lots into the predispatching list; and allows for operators to automatically change the predispatching list to optimize wafer fabrication.

Preferably, the overhead transport system 16 uses automatic guided vehicles 31 to transport the plurality of FOUPs 14 within the TCS 10. The TCS 10 has the following features when a manual insertion of a FOUP into the overhead transport system is needed: Operators assign multiple jobs queued for each equipment; operators must maintain the PD list 60 and must prevent the PD list 60 from becoming empty; operators prioritize lots or orders 62 within the PD list 60; operators use the OMI 32 to selectively load PD lots 62 onto a multi-lot FOUP for manual insertion into the automatic overhead transport system 16 when a manual insertion of a PD lot is necessary; operators compile PD orders in a batch amount for processing by batch type equipment; and operators use the PD list 60 to optimally fill a wafer cassette (not shown) disposed within a FOUP, the wafer cassette may hold one lot or multiple lots. Preferably, each cassette holds a total of 25 wafers, upon having a wafer cassette filled with preferably 25 wafers, the FOUP is ready to be sent to a piece of fabrication equipment.

The TCS 10 has the following features when the dispatching mode is automatic: 1) TCS 10 will automatically fill the PD list 60 when the list is empty, 2) operators can manually insert specific lots into the PD list 60 portion 58 of the OMI display 12 when the priority of specific lots need to be raised; 3) an operator can insert a monitor lots command into the WIP list 38 for lots requiring daily monitoring; 4) a pre-dispatched lot 62 not yet sent to fabrication equipment can be adjusted by operators by using the OMI 32; and 5) lots already dispatched to equipment are prohibited from being adjusted by the PD system.

The present invention provides a method of using the TCS 10 to control and manage a wafer fabrication process during an automated mode and during a manual mode. A method for using the TCS 10 according to a preferred embodiment is shown in FIG. 3. The method is illustrated as a flowchart providing steps necessary to smoothly dispatch wafers to the at least one piece of fabrication equipment 18 by using the OMI 32 upon occurrence of a triggering event. The triggering event occurs when the first load port tool for the piece of fabrication equipment 18 becomes empty (step 90). The TCS 10 then checks piece of fabrication equipment's (EQP) processing status (step 92). If the EQP 18 is ready to receive a FOUP 14 (step 94), the EQP 18 issues a move in request (MIR) to an operation job supervisor (OJS) (step 96). If the EQP is not ready to receive a FOUP 14, the TCS 10 continually queries the EQP's processing status until the EQP signals that it is ready to receive a FOUP (step 98) Next, the OJS determines if the PD list 60 is empty (step 100).

If the PD order list is not empty, then the OJS collects FOUP status information (step 102). Preferably, the step 102 is completed upon verifying that there is a processable lot disposed within a clean FOUP under the overhead transport system 16 control.

If the PD order list is empty using either a manual dispatching mode or an automated dispatching mode, lots must be selected from the WIP list 38 to create a selected lots list 34 in the selected lots configurable portion 56 of the OMI (step 104) and then the lots must be transferred to the PD list portion 58 of the OMI display 12 to create the PD list 60 (step 136). Only a processable lot will be added to the PD list 60.

In a preferred embodiment, creation of the selected lots list 34, step 104 is performed in a manual mode by an OJS. In the manual mode, the OJS uses the TCS 10 to manually select lots from the WIP list 38 and the OJS determines whether the selected lots are available for processing and insertion into the PD list 60 using criteria as discussed in more detail below. Optionally, the OJS can prioritize the PD list 60 and can insert super hot lots into the PD list 60 for immediate dispatching to the overhead transport system 16.

In an alternative preferred embodiment, creation of the selected lots list 34, step 104 is performed automatically by a real time dispatcher 86 (not shown) when the TCS 10 is operating in an automatic mode. An OJS uses the real time dispatcher 86 to query the WIP list 38 for selection of lots to be added to the PD list 60. In an automated mode, the real time dispatcher 86 automatically selects lots from the WIP list 38 and determines whether the selected lots are available for processing using criteria as discussed in more detail below.

Figure 4:
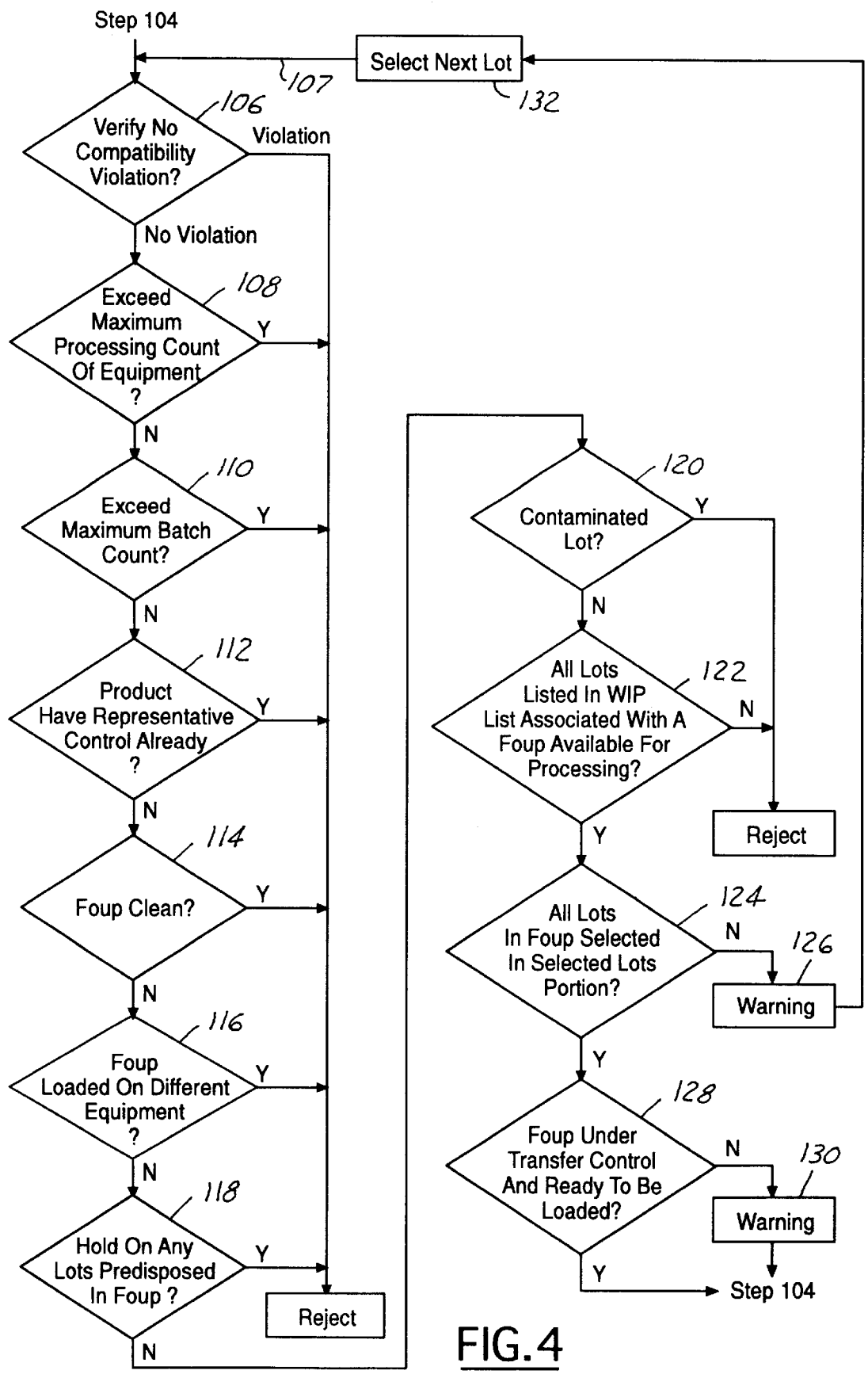
FIG. 4 is a second flowchart representing substeps necessary to evaluate criteria within a step of the first flowchart of FIG. 3 in accordance with the present invention.

According to a preferred embodiment as shown in FIG. 3, preferably, a method 88 of using specific criteria is used to determine whether the selected lots from the WIP list 38 are processable and thus, whether the selected lots should be added to the selected lots list. The method 88 provides a series of substeps necessary to evaluate the processability of the selected lots using the criteria as illustrated in FIG. 4. The conditions for each respective substep must be met for each selected lot be added to the selected lots list. If the criteria are not met, then the lot will be rejected. The method 88 provides the steps of:

1) verifying that no compatibility violation occurred between equipment capability and lot orders from the selected lots list (step 106);
2) verifying that maximum processing count allowed by equipment is not exceeded by addition of selected lots, the lots having a predetermined wafer count (step 108);
3) verifying that a batch order does not exceed an equipment maximum batch count (step 110);
4) verifying that each wafer product having a specific material type has an associated representative lot of control wafers that is monitored for statistical process control (step 112);
5) verifying that a FOUP having at least a processable lot disposed therewithin is clean (step 114);
6) verifying that a FOUP having at least a processable lot for processing within the EQP is not already loaded onto a different piece of equipment (step 116);
7) verifying that no hold exists for a lot disposed within a FOUP (step 118);
8) verifying that no contamination exists within a lot, an associated FOUP, and the specified equipment receiving the associated FOUP (step 120); and
9) verifying that all lots listed in the WIP list within a FOUP are available for processing by the associated piece of processing equipment are filtered in the selected lots configurable portion 56 of the OMI (step 122).

Additionally, in a preferred embodiment, once the processable lots within a FOUP are inserted into the selected lots list, the (OJS) preferably performs additional steps to determine whether a warning should be issued to an operator for identification of a processable lot not ready to be transferred to the PD list 60. The additional steps provide:

1) verifying all lots disposed within a FOUP are in the selected lots configurable portion of the OMI (step 124);
2) issuing a warning from an OJS to an operator when processable lots in the FOUP have not been selected (step 126);
3) verifying that the FOUP is under the overhead transport system control (step 128); and
4) issuing a warning from the (OJS) to an operator when the FOUP is not under transfer system control and is not ready to be loaded onto the overhead transport system (step 130).

If a warning is issued to an operator for not selecting all the lots in the FOUP, steps 126 or step 130, the operator will select the next lot to be added to the selected lots configurable portion 56 of the OMI from the same FOUP (step 132). This process will be continued until the last unselected lot for the FOUP is added to selected lots configurable portion 56 of the OMI (step 134). Next, the (OJS) creates a PD list using the lots that make up the contents of the FOUP in the selected lots configurable portion 56 of the OMI (step 136).

Next, the OJS determines if a FOUP containing the pre-dispatched lots identified at the top of the PD list 60 is available to be loaded onto the overhead transport system 16 (step 138).

If the FOUP is not ready to be loaded onto the overhead transport system 16, the OJS identifies to the FOUP queue that the FOUP containing the pre-dispatched lots identified at the top of the PD list 60 will be assigned to the specific piece of fabrication equipment 18 (step 140), the EQP having an associated machine number and an associated OMI. After identifying placement of the FOUP within the FOUP queue (step 140), the OJS waits a predefined length of time, preferably, 3 minutes (step 142) before verifying again that the FOUP identified at the top of the PD list 60 is available to be loaded onto the overhead transport system 16 (step 144).

If the FOUP is available for loading onto the overhead transport system 16, the OJS removes the group of lots that are within the FOUP from the PD list (step 146) and then, the OJS issues a transfer command to the MCS to load the FOUP onto the overhead transport system 16 for transferring the FOUP to the EQP (step 148). Once the OJS has issued the transfer command (step 148), the TCS 10 identifies that the FOUP is loaded onto the first load port of the EQP 18 (step 150).

Additionally, the PD lots listed in the FOUP are verified by the TCS 10 and the results are communicated from the TCS 10 to the fabrication equipment so that the fabrication equipment can selectively start an appropriate fabrication operation for the specific lots delivered (step 152). Preferably, the TCS 10 issues a Move-In-Complete (MIC) command to the OJS to signal to the OJS that the lots identified within the FOUP were delivered to the fabrication equipment and that the fabrication equipment successfully performed a fabrication operation on the lots identified within the FOUP (step 154).

In one preferred embodiment, as can be gleaned from the drawings, the present invention is employed for coordinating dispatching between an automatic and a manual dispatching system using a TCS, and particularly as part of the manufacture of semiconductor wafers in a fully automated fab. However, the present invention can be employed for other manufacturing processes, materials and applications.

From the foregoing, it should be appreciated that a system and method are provided for flexibly dispatching wafers within a fully automated fabrication facility. While a preferred exemplary embodiment has been presented in the foregoing detailed description, it should be understood that a vast number of variations exist and this preferred exemplary embodiment is merely an example, and it is not intended to limit the scope, applicability or configuration of the invention in any way. Rather, the foregoing detailed description provides those of ordinary skill in the art with a convenient guide for implementing a preferred embodiment of the invention and various changes can be made in the function and arrangements of the exemplary embodiment without departing from the spirit and scope of the appended claims.

What is claimed is:

1. A total control system for managing wafer fabrication in a wafer fabrication process, the total control system comprising:

a plurality of FOUPs for holding at least one lot of wafers;

an overhead transport system for transporting FOUPs from a first location to a second location;

a sorter for sorting a plurality of wafer lots according to a sequence defined by the tool control system for insertion into an individual FOUP or multiple FOUPs;

a ceiling loader and hanger for inserting and removing FOUPs from the overhead transport system;

a buffer holding area for buffering FOUPs waiting to be inserted into the overhead transport system;

at least one piece of fabrication equipment; and an operation management interface providing an interface for an operator to communicate with the tool control system and with the at least one piece of processing equipment to allow coordination between manual and automatic dispatching of FOUPS to the at least one piece of fabrication equipment within a full automatic fab.

2. The tool control system of claim 1, wherein the FOUPs in the buffer holding area are manually inserted into the overhead transport system.

3. The tool control system of claim 1 wherein the at least one piece of fabrication is a processing or a pre-processing machine used in the manufacture of semiconductor wafers.

4. The tool control system of claim 1, wherein the operation management interface comprises a configurable display, wherein the operation management interface is in operable communication with the at least piece of fabrication equipment, wherein the operation management interface is in further operable communication with a plurality of other operation management interface s disposed within the tool control system, and wherein each operation management interface is respectively associated with an associated piece of fabrication equipment.

5. The tool control system of claim 4, wherein the configurable operation management interface display comprises:

a plurality of configurable selectable fields associated with the associated at least one piece of fabrication equipment, the configurable selectable fields providing identification of an associated fabrication machine number, a machine type, and an associated machine status.

6. The tool control system of claim 4, wherein the configurable display comprises:

a work in progress dispatching portion for displaying a work in progress list, the work in progress list having a plurality of selectable lots disposed therewithin;

a selected lots configurable portion for selecting one or a plurality of selectable lots having an associated lot order number from the work in progress list for processing by the associated at least one piece of fabrication equipment;

a pre-dispatch list portion having a pre-dispatch list, the pre-dispatch list providing list of individual pre-dispatch lots.

7. The tool control system of claim 6, wherein the work in progress list comprises:

selectable associated fields for selecting and monitoring each dispatched lot waiting to be processed.

8. The tool control system of claim 6, wherein the pre-dispatch portion comprises:

a plurality of configurable pre-dispatch function buttons for configuring each lot within the pre-dispatch list, wherein the pre-dispatch list is prioritized prior to dispatching FOUPs to the associated piece of equipment, and wherein each lot is classified according to a preset number, an order number, a foup number, and a specific date and time.

9. The tool control system of claim 8, wherein the plurality of configurable pre-dispatch function buttons cooperate to define a preset number, a newly added order, removal of an order, a canceling of an order, a presetting of an order, an adjustment of a pre-dispatch sequence, and an adjustment of a fabrication machine.

10. The tool control system of claim 1, wherein the at least one piece of fabrication equipment comprises an associated machine number and an associated operational status.

11. The tool control system of claim 1, the tool control system further comprising:
a first load port tool providing a loading port to the at least one piece of fabrication equipment;
a second load port tool in communication with the sorter for communicating sorted wafer lots from the sorter to a FOUP available to be sent from the buffer holding area to the at least one piece of fabrication equipment; and
a third load port tool for loading FOUPs from the buffer holding area to the overhead transport system.

12. The tool control system of claim 11, wherein a FOUP disposed within the buffer holding area is sequenced within a FOUP queue waiting to be processed by the at least one piece of fabrication equipment by loading the FOUP from the buffer holding area into the at least second load port.

13. The tool control system of claim 11, wherein a FOUP holding a super hot lot disposed within the buffer holding area is manually inserted into the overhead transport system for direct routing to the at least one piece of fabrication equipment.

14. The tool control system of claim 1, wherein the overhead transport system comprises a shortcut for routing FOUPs unavailable for processing within the at least one piece of fabrication equipment to the ceiling loader and hanger.

15. A method of using a tool control system to control and manage a wafer fabrication process during an automated mode and during a manual mode, the method comprising the steps of
using an operation management interface to dispatch wafers to an at least one piece of fabrication equipment upon occurrence of a triggering event, the triggering event occurring when a first load port tool for the piece of fabrication equipment becomes empty;
checking the at least one piece of fabrication equipment's processing status;
issuing a move in request to an operation job supervisor if the at least one piece of fabrication equipment having a first load port is ready to receive a FOUP;
querying the at least one piece of fabrication equipment's processing status until the at least one piece of fabrication equipment signals that it is ready to receive a FOUP;
determining if a pre-dispatch list is empty;
collecting FOUP status information if the pre-dispatch list is not empty;
selecting lots from a work in progress list to create a selected lots list in a selected lots configurable portion of the operation management interface if the pre-dispatch list is empty;
transferring the selected lots list from the selected lots configurable portion of the operation management interface to the pre-dispatch portion to create a pre-dispatch list;

determining if a FOUP containing the pre-dispatched lots identified at the top of the pre-dispatch list is available to be loaded onto an overhead transport system;
waiting a predefined length of time if the FOUP containing the pre-dispatched lots identified at the top of the list is not available before verifying again that the FOUP identified at the top of the pre-dispatch list is available to be loaded onto the overhead transport system;
identifying to a FOUP queue that the FOUP containing the pre-dispatched lots identified at the top of the pre-dispatch list will be assigned to the specific piece of fabrication equipment;
identifying placement of the FOUP within the FOUP queue;
removing the lots contained within the FOUP from the pre-dispatch list if the FOUP is available for loading onto the overhead transport system;
issuing a transfer command to the MCS to load the FOUP onto the overhead transport system for transferring the FOUP to the at least one piece of fabrication equipment;
identifying that the FOUP is loaded onto the first load port of the at least one piece of fabrication equipment;
verifying the pre-dispatch lots listed in the FOUP are delivered to the at least one piece of fabrication equipment; and
communicating the verification from the tool control system to the at least one piece of fabrication equipment so that the at least one piece of fabrication equipment selectively start an appropriate fabrication operation for the specific lots delivered.

16. The method of claim 15, further comprising the step of:
issuing a move-in-complete command to an operation job supervisor to signal to the operation job supervisor that the lots identified within the FOUP were delivered to the fabrication equipment and that the fabrication equipment successfully performed a fabrication operation on the lots identified within the FOUP.

17. The method of claim 15, further comprising the step of determining whether a warning should be issued to an operator for identification of a processable lot not ready to be transferred to the pre-dispatch list by performing the substeps of:
1) verifying all lots disposed within a FOUP are in the selected lots configurable portion of the operation management interface;
2) issuing a warning from an operation job supervisor to an operator when processable lots in the FOUP have not been selected;
3) verifying that the FOUP is under the overhead transport system control; and
4) issuing a warning from the operation job supervisor to an operator when the FOUP is not under transfer system control and is not ready to be loaded onto the overhead transport system.

18. The method of claim 17 wherein if a warning to an operator for not selecting all the lots in the FOUP, an additional method is performed, the additional method comprising:
selecting a next lot to be added to the selected lots configurable portion of the operation management interface from the same FOUP;
continuing selecting a next lot to be added until a last unselected lot for the FOUP is added to selected lots configurable portion of the operation management interface;

creating a pre-dispatch list using the lots that make up the contents of the FOUP in the selected lots configurable portion of the operation management interface.

19. The method of claim 15, wherein the step of creating selected lots list further comprises the steps of:
using the tool control system to manually select lots from the work in progress list when the tool control system is operating in a manual dispatching mode;
determining whether the selected lots are available for processing and insertion into the pre-dispatch list using predefined criteria;
prioritizing the pre-dispatch list; and
inserting super hot lots into the pre-dispatch list for immediate dispatching to the overhead transport system.

20. The method of claim 19, wherein the step of determining whether the selected lots are available for processing and insertion into the pre-dispatch list using predefined criteria is performed using the following substeps:
1) verifying that no compatibility violation occurred between equipment capability and lot orders from the selected lots list;
2) verifying that maximum processing count allowed by equipment is not exceeded by addition of selected lots, the lots having a predetermined wafer count;
3) verifying that a batch order does not exceed an equipment maximum batch count;
4) verifying that each wafer product having a specific material type has an associated representative lot of control wafers that is monitored for statistical process control;
5) verifying that a FOUP having at least a processable lot disposed therewithin is clean;
6) verifying that a FOUP having at least a processable lot for processing within the at least one piece of fabrication equipment is not already loaded onto a different piece of equipment;
7) verifying that no hold exists for a lot disposed within a FOUP;
8) verifying that no contamination exists within a lot, an associated FOUP, and the specified equipment receiving the associated FOUP; and
9) verifying that all lots listed in the work in progress list within a FOUP are available for processing by the associated piece of processing equipment are filtered in the selected lots configurable portion of the operation management interface.

21. The method of claim 15, wherein the step of creating selected lots list further comprises the steps of:
using a real time dispatcher to create the selected lots list when the tool control system is operating in an automatic dispatching mode, the step of using the real time dispatcher further comprises:
querying the work in progress list for selection of lots to be added to the pre-dispatch list to automatically select lots from the work in progress list; and
determining whether the selected lots are available for processing using predefined criteria.

22. The method of claim 21, wherein the step of determining whether the selected lots are available for processing and insertion into the pre-dispatch list using predefined criteria is performed using the following substeps:
1) verifying that no compatibility violation occurred between equipment capability and lot orders from the selected lots list;
2) verifying that maximum processing count allowed by equipment is not exceeded by addition of selected lots, the lots having a predetermined wafer count;
3) verifying that a batch order does not exceed an equipment maximum batch count;
4) verifying that each wafer product having a specific material type has an associated representative lot of control wafers that is monitored for statistical process control;
5) verifying that a FOUP having at least a processable lot disposed therewithin is clean;
6) verifying that a FOUP having at least a processable lot for processing within the at least one piece of fabrication equipment is not already loaded onto a different piece of equipment;
7) verifying that no hold exists for a lot disposed within a FOUP;
8) verifying that no contamination exists within a lot, an associated FOUP, and the specified equipment receiving the associated FOUP; and
9) verifying that all lots listed in the work in progress list within a FOUP are available for processing by the associated piece of processing equipment are filtered in the selected lots configurable portion of the operation management interface.

23. The method of claim 15, wherein the predefined length of time to wait if the FOUP containing the pre-dispatched lots identified at the top of the list is not available is three minutes.

24. A method of using a tool control system to control and manage a wafer fabrication process during an automated mode and during a manual mode, the method comprising the steps of:
using an operation management interface to dispatch wafers to an at least one piece of fabrication equipment upon occurrence of a triggering event, the triggering event occurring when a first load port tool for the piece of fabrication equipment becomes empty;
checking the at least one piece of fabrication equipment's processing status;
issuing a move in request to an operation job supervisor if the at least one piece of fabrication equipment having a first load port is ready to receive a FOUP;
querying the at least one piece of fabrication equipment's processing status until the at least one piece of fabrication equipment signals that it is ready to receive a FOUP;
determining if a pre-dispatch list is empty;
collecting FOUP status information if the pre-dispatch list is not empty;
selecting lots from a work in progress list to create a selected lots list in a selected lots configurable portion of the operation management interface if the pre-dispatch list is empty;
transferring the selected lots list from the selected lots configurable portion of the operation management interface to the pre-dispatch portion to create a pre-dispatch list;
determining if a FOUP containing the pre-dispatched lots identified at the top of the pre-dispatch list is available to be loaded on to an overhead transport system;
waiting three minutes if the FOUP containing the pre-dispatched lots identified at the top of the list is not available before verifying again that the FOUP identified at the top of the pre-dispatch list is available to be loaded onto the overhead transport system;

identifying to a FOUP queue that the FOUP containing the pre-dispatched lots identified at the top of the pre-dispatch list will be assigned to the specific piece of fabrication equipment;

identifying placement of the FOUP within the FOUP queue;

removing the lots contained within the FOUP from the pre-dispatch list if the FOUP is available for loading onto the overhead transport system;

issuing a transfer command to the MCS to load the FOUP onto the overhead transport system for transferring the FOUP to the at least one piece of fabrication equipment;

identifying that the FOUP is loaded onto the first load port of the at least one piece of fabrication equipment;

verifying the pre-dispatch lots listed in the FOUP are delivered to the at least one piece of fabrication equipment;

communicating the verification from the tool control system to the at least one piece of fabrication equipment so that the at least one piece of fabrication equipment selectively start an appropriate fabrication operation for the specific lots delivered; and issuing a move-in-complete command to an operation job supervisor to signal to the operation job supervisor that the lots identified within the FOUP were delivered to the fabrication equipment and that the fabrication equipment successfully performed a fabrication operation on the lots identified within the FOUP.

* * * * *